United States Patent
Kummetz et al.

(10) Patent No.: US 9,647,341 B2
(45) Date of Patent: May 9, 2017

(54) ANTENNA STRUCTURE FOR DISTRIBUTED ANTENNA SYSTEM

(71) Applicant: CommScope Technologies LLC, Hickory, NC (US)

(72) Inventors: Thomas Kummetz, Forest, VA (US); Narian Izzat, Aylesford (GB); John M Hodorowski, Madison Heights, VA (US); Fred W Phillips, Forest, VA (US); Charles B Morrison, Forest, VA (US)

(73) Assignee: CommScope Technologies LLC, Hickory, NC (US)

( * ) Notice: Subject to any disclaimer, the term of this patent is extended or adjusted under 35 U.S.C. 154(b) by 751 days.

(21) Appl. No.: 13/733,279

(22) Filed: Jan. 3, 2013

(65) Prior Publication Data

US 2013/0169501 A1     Jul. 4, 2013

Related U.S. Application Data

(60) Provisional application No. 61/582,917, filed on Jan. 4, 2012.

(51) Int. Cl.
*H01Q 9/16* (2006.01)
*H03H 7/42* (2006.01)
(Continued)

(52) U.S. Cl.
CPC ............... *H01Q 9/16* (2013.01); *H01P 5/10* (2013.01); *H01Q 9/28* (2013.01); *H01Q 21/26* (2013.01); *H03H 7/42* (2013.01)

(58) Field of Classification Search
CPC ........................................................ H01Q 9/16
(Continued)

(56) References Cited

U.S. PATENT DOCUMENTS 5,945,951 A    8/1999 Monte et al.
6,028,563 A    2/2000 Higgins
(Continued)

OTHER PUBLICATIONS

Choi, S. et al., Clover-shaped antenna for ultra-wideband communications, Microwave and Optical Technology Letters, vol. 48, No. 10, pp. 2111-2113, 2006.
(Continued)

*Primary Examiner* — Graham Smith
*Assistant Examiner* — Andrea Lindgren Baltzell
(74) *Attorney, Agent, or Firm* — Fogg & Powers LLC

(57) ABSTRACT

One embodiment discloses an antenna structure. The antenna structure may comprise a transmit antenna element comprising a first transmit antenna sub-element and a second transmit antenna sub-element. The antenna structure can comprise a receive antenna element comprising a first receive antenna sub-element and a second receive antenna sub-element. At least one electronic component of the antenna structure may be coupled with a ground plane. The first transmit antenna sub-element, the second transmit antenna sub-element, the first receive antenna sub-element, and the second receive antenna sub-element may each comprise a first portion and a second portion. The second portion may be larger than the first portion. The first portion can be closer to a center position of an arrangement of the sub-elements than the second portion. In one embodiment, the arrangement of the sub-elements about the center position forms a four-leaf clover-like arrangement.

20 Claims, 12 Drawing Sheets

(51) Int. Cl.
*H01Q 9/28* (2006.01)
*H01Q 21/26* (2006.01)
*H01P 5/10* (2006.01)

(58) Field of Classification Search
USPC .......................................................... 343/795
See application file for complete search history.

(56) References Cited

U.S. PATENT DOCUMENTS

| | | | |
|---|---|---|---|
| 6,366,254 | B1 | 4/2002 | Sievenpiper et al. |
| 6,498,589 | B1 | 12/2002 | Horii |
| 6,518,931 | B1 | 2/2003 | Sievenpiper |
| 6,597,325 | B2 | 7/2003 | Judd et al. |
| 6,618,016 | B1 | 9/2003 | Hannan et al. |
| 6,859,182 | B2 | 2/2005 | Horii |
| 7,209,089 | B2 | 4/2007 | Schantz |
| 7,372,424 | B2 | 5/2008 | Mohuchy et al. |
| 7,551,144 | B2 | 6/2009 | Manholm et al. |
| 7,616,168 | B2 | 11/2009 | Tillery |
| 2010/0311352 | A1* | 12/2010 | Behzad .............. H01L 23/3677 455/77 |
| 2011/0223925 | A1 | 9/2011 | Gale et al. |
| 2011/0255250 | A1* | 10/2011 | Dinh .................... G03B 15/03 361/749 |
| 2012/0098725 | A1* | 4/2012 | Lytle .................... H01Q 1/246 343/797 |

OTHER PUBLICATIONS

Lim, J. et al., A 800- to 3200-MHz wideband CPW balun using multistage wilkinson structure, IEEE MTT-S International Microwave Symposium Digest, pp. 1141-1144, 2006.

Narbudpwicz, A. et al., Clover array-polarisation diversity solutions for ultra wideband systems, Progress in Electromagnetios Research Letters, vol. 10, pp. 163-170, 2009.

Nguyen, T. et al., Four-leaf clover-shaped antenna on an extended hemisperical lens for a high-output-power THz photomixer, 35th International Conference on Infrared Millimeter and Terahertz Waves (IRMMW-THz), pp. 1-2, 2010.

Smith, P. et al., Cloverleaf antenna for F.M. broadcasting, Proceedings of the I.R.E., vol. 35, No. 12, pp. 1556-1563, 1947.

Suh, S., A comprehensive investigation of new planar wideband antennas, Dissertation, Virginia Polytechnic Institute and State University, Virginia, 2002.

Suh, S. et al., A novel printed dual polarized broadband antenna—the fourclover antenna, Proceedings of ISAp, 04, Sendai, Japan, pp. 77-80.

Watanabe, T. et al., A rectangular-cavity-backed cloverleaf slot antenna for circular polarization, The Ninth International Conference on Communications Systems, pp. 595-597, 2004.

* cited by examiner

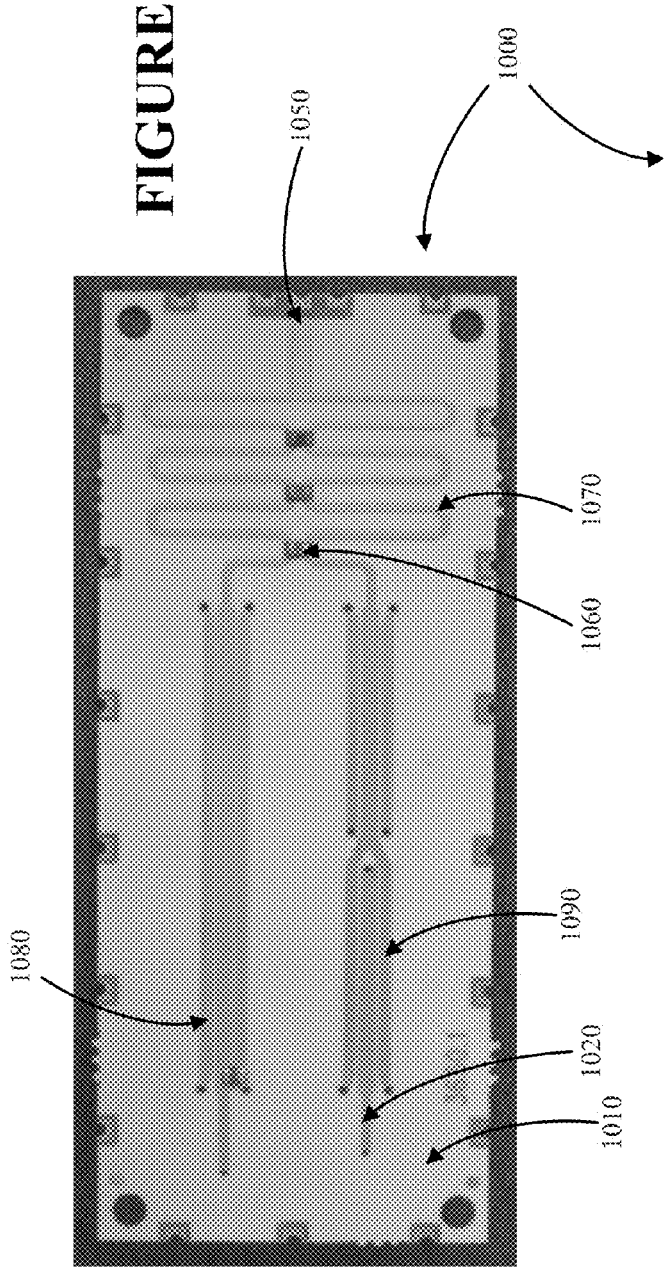
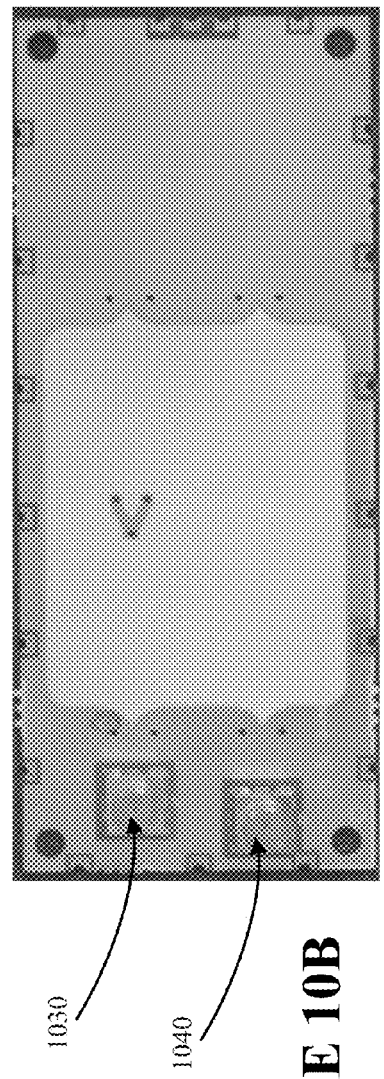
FIGURE 10A
FIGURE 10B

ANTENNA STRUCTURE FOR DISTRIBUTED ANTENNA SYSTEM

CROSS-REFERENCE TO RELATED APPLICATION

This application claims priority to U.S. Provisional Patent Application No. 61/582,917, filed Jan. 4, 2012, entitled "Antenna Structure for Distributed Antenna System," the entirety of which is hereby incorporated by reference.

FIELD OF THE INVENTION

This disclosure relates generally to a distributed antenna system ("DAS") and more particularly relates to an antenna structure that may be used in a DAS.

BACKGROUND

A DAS can be used to extend coverage for a wireless network. A DAS can include one or more master units in communication with one or more base stations and in communication with one or more remote units. A remote unit can be associated with an antenna structure that can transmit and receive signals with one or more mobile units. An antenna structure can be deployed in various locations. For example, an antenna structure may be deployed inside a building and may be mounted to a ceiling. Current antenna structures, however, do not provide sufficiently high isolation between transmit and receive antennas, operate over a large bandwidth, have a physically low profile, and meet coverage requirements that may be desired in such an installation. Devices, systems, and methods that address at least some of these considerations are desirable.

SUMMARY

One embodiment involves an antenna structure that provides high isolation between transmit and receive antennas, has a large operating bandwidth, has a physically low profile, and meets coverage requirements for various installations. In this embodiment, an isolation of 40 dB or greater is provided between a transmit antenna and a receive antenna in the antenna structure. The antenna structure may have an operating bandwidth of 380 MHz to 2700 MHz. The overall thickness of the antenna structure may be approximately 2.75 inches. Thus, if the antenna structure is mounted to a ceiling inside a building, the antenna structure may hang down approximately 2.75 inches from the ceiling.

These illustrative features are mentioned not to limit or define the disclosure, but to provide examples to aid understanding thereof. Additional embodiments are discussed in the Detailed Description, and further description is provided there. Advantages offered by one or more of the embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings, where:

FIGS. 10A-10B illustrate views of a balanced to unbalanced (BALUN) circuit according to an embodiment.

DETAILED DESCRIPTION

Devices, systems, and methods disclosed herein relate generally to a DAS and more particularly relates to an antenna structure that may be used in a DAS. An antenna structure according to some embodiments is broad beam and includes an antenna component. In one embodiment, the antenna component includes orthogonally-polarized antenna elements positioned above active circuitry. For example, one antenna element may transmit signals and the other antenna element may receive signals. Each antenna element includes at least two sub-elements. The antenna elements may be formed using four sub-elements (e.g., two for one antenna element and two for the other antenna element) configured in a four-leaf clover-like arrangement about a center position. Each antenna sub-element can have a first portion that is positioned closer to the center position than the second portion. The second portion can have a greater cross-sectional width than the first portion and the second portion can be at least partially conical. The antenna elements can be disposed in a housing with respect to a ground plane that includes active circuitry usable for transmitting and receiving signals via the antenna elements. An air gap may be present between the antenna elements and the ground plane.

Illustrative Environments

Figure 1:
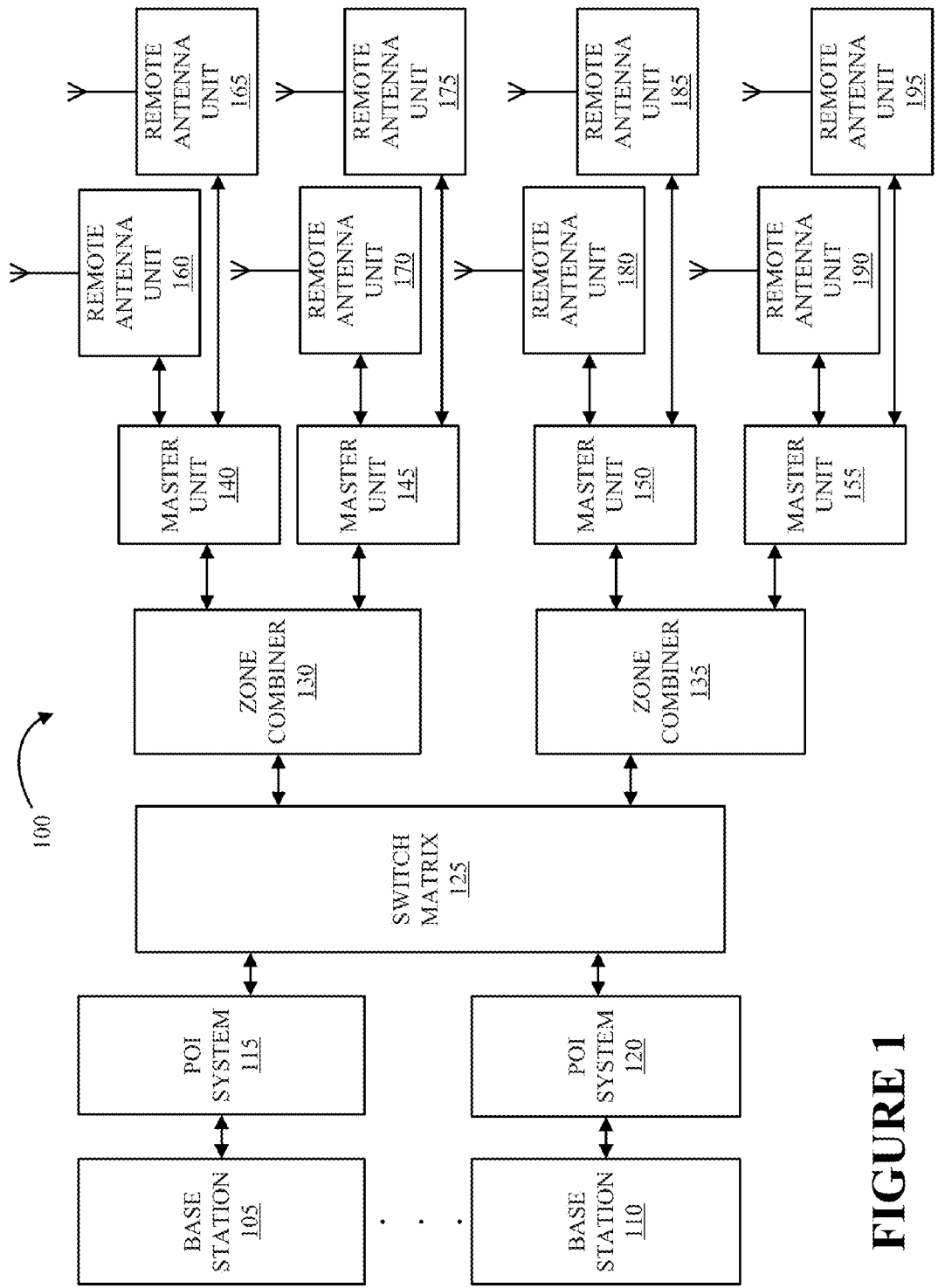
FIG. 1 illustrates a system depicting devices in an environment according to an embodiment.

FIG. 1 illustrates a system 100 depicting devices in an environment according to an embodiment. The system 100 shown in FIG. 1 depicts a DAS having point-of-interface (POI) systems 115, 120 in communication with base stations 105-110 and a switch matrix 125. The DAS 100 can also include master units 140-155 in communication with zone combiners 130, 135, and the remote antenna units 160-195. Each of the zone combiners 130, 135 can combine uplink signals from more than one master unit and provide a combined uplink signal to one of the POI systems 115, 120 selected via the switch matrix 125. In some embodiments, the switch matrix 125 and zone combiners 130, 135 can be omitted and the master units 140-155 can communicate directly with POI system 115 or POI system 120. The DAS 100 can be positioned in an area to extend wireless communication coverage.

In the direction of a downlink path, the DAS 100 can receive signals from the base stations 105-110 via a wired or wireless communication medium. Downlink signals can be received by the POI systems 115, 120. The POI systems 115, 120 can provide the downlink signals to the master units 140-155 via the switch matrix 125 and the zone combiners 130, 135. The master units 140-155 can communicate with the zone combiners 130, 135 via any communication medium capable of carrying signals between the zone combiners 130, 135 and the master units 140-155. Examples of a suitable communication medium include copper wire (such as a coaxial cable), optical fiber, and microwave or optical link. The link can transport the signals in analog or in digitized form.

The master units 140-155 can provide downlink signals to the remote antenna units 160-195. The remote antenna units 160-195 can communicate with the master units 140-155 via any communication medium capable of carrying signals between the master units 140-155 and the remote antenna units 160-195. Examples of a suitable communication medium include copper wire (such as a coaxial cable), optical fiber, and microwave or optical link. The link can transport the signals in analog or in digitized form. The remote antenna units 160-195 can radiate the signals of the sector(s) distributed to the physical area.

In the direction of an uplink path, the POI systems 115, 120 can receive uplink signals from remote antenna units 160-195 via the master units 140-155, the zone combiners 130, 135, and the switch matrix 125. A remote antenna unit, such as remote antenna unit 160, may be associated with an antenna structure that can transmit and receive signals with one or more mobile units. For example, in one embodiment, an antenna structure may be coupled to the remote antenna unit 160. In another embodiment, the antenna structure is in communication with the remote antenna unit 160.

These illustrative environments are given to introduce the reader to the general subject matter discussed here and are not intended to limit the scope of the disclosed concepts. The following sections describe various additional embodiments and examples with reference to the drawings in which like numerals indicate like elements. Other embodiments will readily suggest themselves to such skilled persons having benefit of this disclosure. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another.

Illustrative Antenna Structure

Figure 2:
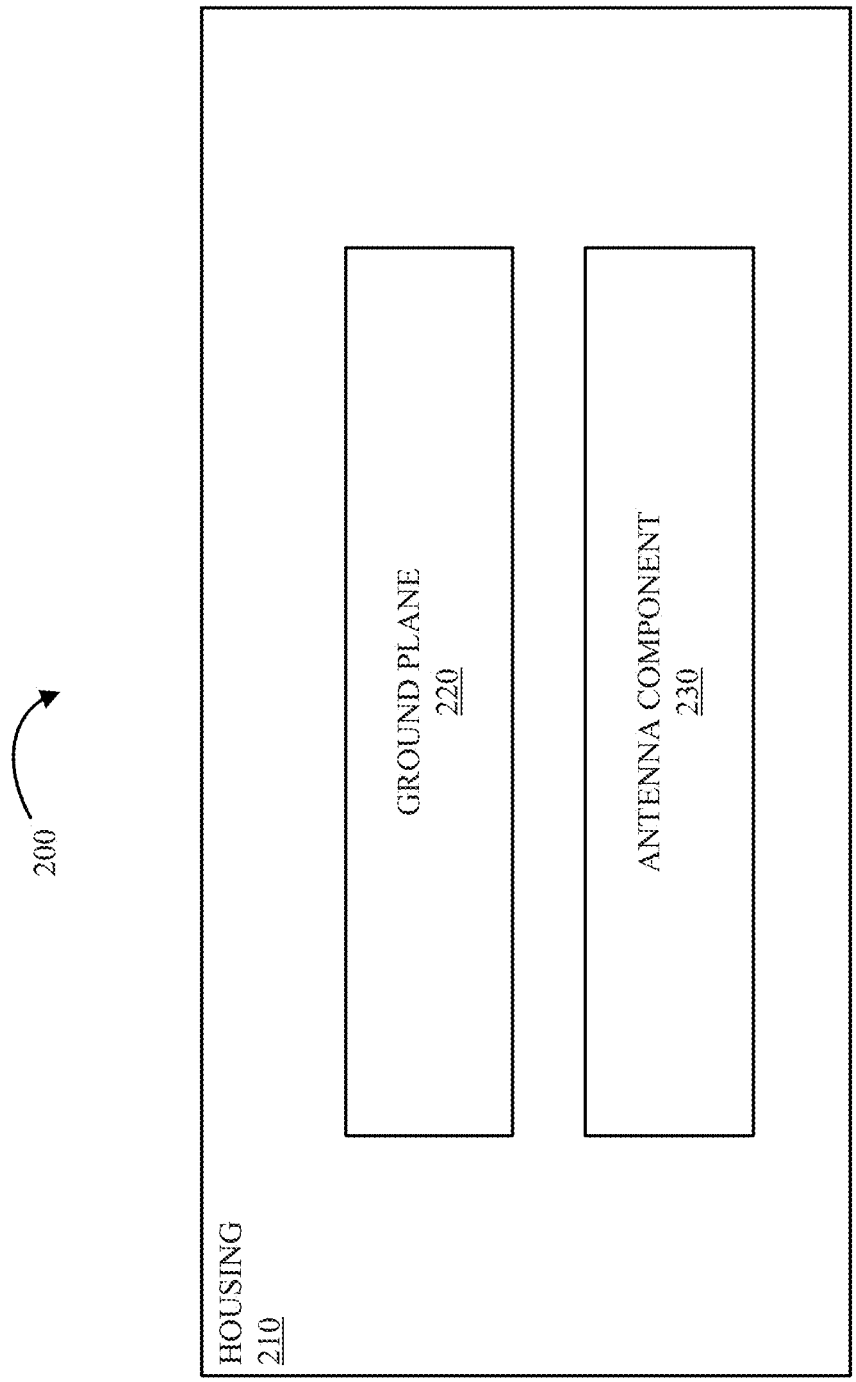
FIG. 2 illustrates an antenna structure according to an embodiment.

FIG. 2 illustrates an antenna structure 200 according to an embodiment. The antenna structure 200 shown in FIG. 2 includes a housing 210, a ground plane 220, and an antenna component 230. The housing 210 provides protection for the various components of the antenna structure 200. For example, the housing 210 can provide protection for the ground plane 220 and the antenna component 230. The ground plane 220 forms a reflector or director for the antenna component 230 and permits the antenna to function as such. The antenna component 230 receives or transmits, or both, electromagnetic waves.

In certain embodiments, the antenna structure 200 provides high isolation between a transmit antenna element and a receive antenna element in the antenna component 230. For example, the antenna structure 200 may provide approximately 40 dB or greater isolation between a transmit antenna element and a receive antenna element in the antenna structure 200. In some embodiments, the antenna structure 200 is broad beam and includes orthogonally-polarized antenna elements, such as a receive antenna element and a transmit antenna element, positioned above active circuitry.

In embodiments, the antenna structure 200 has a large operating bandwidth. For example, the antenna structure 200 may have an operating bandwidth of approximately 380 MHz to approximately 2700 MHz. In one embodiment, the antenna structure 200 has a regular frequency range of approximately 600 MHz to approximately 2700 MHz. In another embodiment, the antenna structure 200 has a degraded performance frequency range of approximately 380 MHz to approximately 600 MHz. In such an embodiment, the gain for the degraded performance frequency range may be approximately 10 dB lower than for the regular frequency range. In one embodiment, the antenna structure 200 has at least a 9:1 or greater bandwidth.

In embodiments, the antenna structure 200 physically has a low profile. For example, in one embodiment, the overall dimensions of the antenna structure 200 are approximately 12 inches by 12 inches by 2.5 inches. In another embodiment, the antenna structure 200 has a height of approximately 2.75 inches. In some embodiments, the antenna structure 200 may have a height of 3 inches or less. In an embodiment, the overall dimensions of the antenna structure 200 are approximately 7 inches by 7 inches by 2 inches. In some embodiments, the antenna structure 200 meets coverage requirements when deployed in an in-building setting. For example, the antenna structure 200 may be mounted to a ceiling of a building and can provide coverage for at least a portion of a floor of the building.

The housing 210 may be made of any suitable material or materials. For example, in one embodiment, the housing 210 is made of plastic. In other embodiments, the housing 210 can be made from fiberglass, steel, aluminum, copper, brass, various plastics, one or more alloys, or a combination thereof. The thickness of the material or materials used in the housing 210 may be uniform. For example, in one embodiment, the thickness of the material used in the housing 210 is approximately 0.12 inches thick. In other embodiments, the thickness of the material or materials used in the housing 210 may be any thickness so long as the overall antenna structure 200 has a low profile. In still other embodiments, the thickness of the material or materials used in the housing 210 may be non-uniform. For example, the thickness of the material or materials used on one or more sides of the housing 210 may have a different thickness than the thickness of the material or materials used on the top or bottom, or both, of the housing 210.

In some embodiments, the housing 210 is made as one integral piece. In other embodiments, the housing 210 can include multiple pieces that fit together to form the housing 210 for the antenna structure 200. For example, the housing 210 may have a top housing and a bottom housing. In this embodiment, the top housing and the bottom housing may fit together or otherwise connect to form the housing 210 for the antenna structure 210. In one embodiment, the top housing is made of plastic having a thickness of approximately 0.12 inches and the bottom housing is made of plastic having a thickness of approximately 0.12 inches. In this embodiment, when the top housing and the bottom housing are fitted together, the antenna structure 200 has overall dimensions of approximately 12 inches by 12 inches by 2.8 inches. The various pieces that fit together to form the housing 210 for the antenna structure 200 can be made of the same or different materials. In embodiments, the various pieces that form the housing 210 have the same thickness. In other embodiments, one or more of the pieces may have a different thickness than another piece that forms the housing 210. The various pieces that form the housing 210 can be any number of thicknesses and made of one or more materials so long as the overall antenna structure 200 has a low profile.

The housing 210 of the antenna structure 200 may have one or more openings. The one or more openings may be configured to connect one or more components of the antenna structure 200 with an external source. For example, the housing 210 may have one or more openings suitable to receive an RJ45 connector. In one embodiment, the housing 210 has one or more openings for receiving two or more RJ45 connectors. In other embodiments, the housing 210 may have one or more openings needed to receive any number of inputs or outputs including, but not limited to, one or more coaxial cables or power sources. For example, referring to FIG. 1, the antenna structure 200 may have one or more openings in the housing 210 to allow various components in the antenna structure 200 to be connected with or otherwise communicate with a master unit, such as master unit 140.

The housing 210 can alternatively or additionally have one or more openings for ventilation. In one embodiment, the housing 210 has slotted openings on the sides of the housing which provides ventilation for at least some components in the antenna structure 200 such as electronic components coupled with the ground plane 220. The housing 210 may contain one or more vents positioned on one or more sides of the housing 210. In some embodiments, the housing 210 has one or more vents positioned on the top or the bottom, or both, of the housing 210. The housing 210 can have an opening in which one or more fans can be positioned and used for ventilation. For example, the housing 210 may have an opening on one side of the housing 210 fitted for a first fan and an opening on the opposite side of the housing 210 fitted for a second fan. In embodiments, the housing 210 may have one or more openings for one or more fans that can be positioned in any suitable position on the housing 210 to provide ventilation to various components in the antenna structure 200.

In embodiments, the housing 210 of the antenna structure 200 may be mounted directly to a surface such that there is no gap between the surface and substantially all of one side of the housing 210. For example, the housing 210 may be mounted directly to a ceiling of a building. In this embodiment, there is no gap between the portion of the housing 210 mounted to the ceiling and the ceiling. In other embodiments, there is a gap between the portion of the housing 210 mounted to the ceiling and the ceiling. For example, there may be an air gap between the housing 210 and a surface to which the housing 210 is mounted. In one embodiment, the air gap between the housing 210 and a surface to which the housing 210 is mounted to is approximately 0.25 inches. In another embodiment, the air gap between the housing 210 and a surface to which the housing 210 is mounted to is approximately 0.5 inches. An air gap, if any, between the housing 210 and a surface to which the housing 210 is mounted can be any number of sizes so long as the overall antenna structure 200, including any air gap, has a low profile.

The ground plane 220 may be made of any suitable material. In one embodiment, the ground plane is disposed on a printed circuit board (PCB) assembly. In this embodiment, the ground plane 220 can be a layer of copper. In other embodiments, the ground plane may be a sheet of metal, silver, copper, gold, aluminum, other elements, other alloys, any other suitable electronically conductive surface, or a combination thereof. The ground plane 220 may have any suitable dimensions so long as the overall antenna structure 200 has a low profile. For example, in one embodiment, the ground plane is positioned in a PCB and the PCB has a thickness of approximately 0.1 inches. In this embodiment, the PCB can have a length of approximately 11.6 inches and a width of approximately 11.6 inches.

Figure 3:
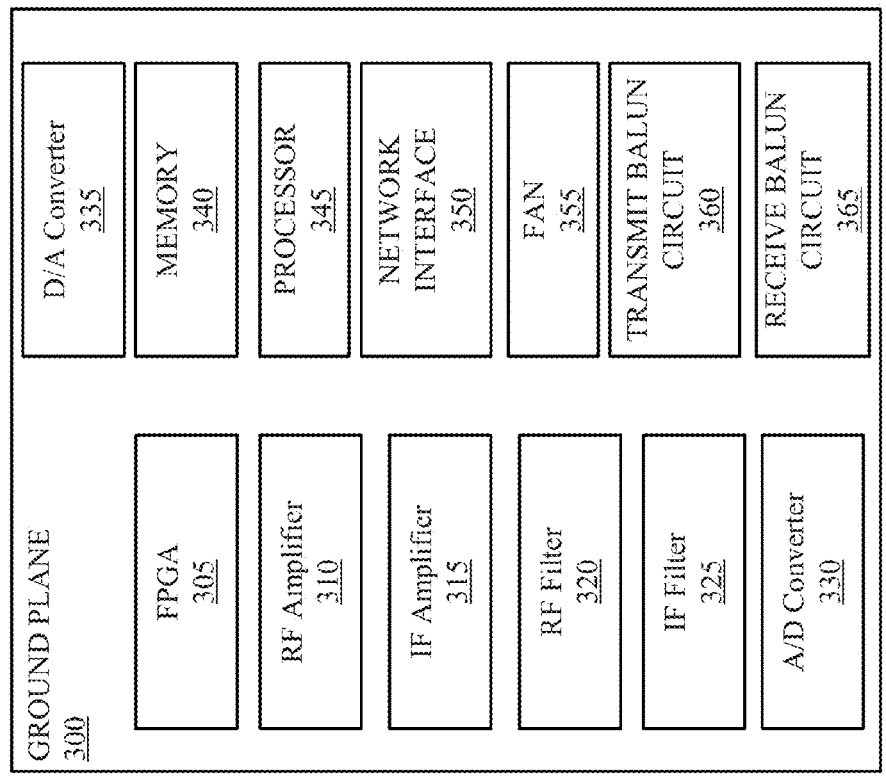
FIG. 3 is a block diagram depicting electronic components coupled with a ground plane of an antenna structure according to an embodiment.

The ground plane 220 may be coupled with one or more electronic components. For example, FIG. 3 is a block diagram depicting electronic components coupled with a ground plane 300 of an antenna structure according to an embodiment. As shown in FIG. 3, the ground plane 300 can be in communication with any number of electronic components. For example, the ground plane 300 may be coupled to one or more field-programmable gate arrays (FPGAs), such as FPGA 305 shown in FIG. 3. In such an embodiment, one or more FPGAs may provide signal processing for transmitting or receiving communications, or both. The ground plane 300 may be coupled with one or more RF amplifiers 310 or IF amplifiers 315, or both. In various embodiments, the ground plane 300 is coupled with one or more RF filters 320 or IF filters 325. The ground plane 300 can be coupled to one or more analog-to-digital (A/D) converters or one or more digital-to-analog (D/A) converters, or both. For example, in FIG. 3, the ground plane 300 is coupled with A/D converter 330 and D/A converter 335. The ground plane 300 may also be coupled with additional supporting circuitry such as one or more voltage regulators.

The ground plane 300 shown in FIG. 3 is coupled with a tangible computer-readable medium such as a random access memory (RAM) 340 coupled to a processor 345 that executes computer-executable program instructions and/or accesses information stored in memory 310. A computer-readable medium may comprise, but is not limited to, an electronic, optical, magnetic, or other tangible storage device capable of providing a processor with computer-readable instructions. Other examples comprise, but are not limited to, magnetic disk, memory chip, ROM, RAM, an ASIC, a configured processor, optical storage, magnetic tape or other magnetic storage, or any other medium from which a computer processor can read instructions. In one embodiment, the ground plane 300 may be coupled with a single type of computer-readable medium such as random access memory (RAM). In other embodiments, the ground plane 300 may be coupled with two or more types of computer-readable medium such as RAM and ROM.

The embodiment shown in FIG. 3, comprises a processor 345 which executes computer-executable program instructions and/or accesses information stored in memory 340. The instructions may comprise processor-specific instructions generated by a compiler and/or an interpreter from code written in any suitable computer-programming language including, for example, Assembly, C, C++, C#, Visual Basic, Java, Python, Perl, JavaScript, and ActionScript®. In an embodiment, the ground plane 300 is coupled with a single processor 345. In other embodiments, the ground plane 300 is coupled with two or more processors. In various embodiments, the ground plane 300 may be coupled with one or more microprocessors.

Referring back to FIG. 3, the ground plane 300 is coupled with or otherwise in communication with a network interface 350 for communicating via wired communication. For example, the ground plane 300 may be coupled to one or more Ethernet physical transceivers (PHYceivers). The network interface 350 may allow for communication over networks via Ethernet. In one embodiment, network interface 350 provides one or more connections for one or more cables, such as one or more CAT5 or CAT6 A cables. In other embodiments, network interface 350 allows communication through a suitable communication medium such as copper wire or optical fiber. The ground plane 300 may be coupled with two or more network interfaces 350 for communication over one or more networks.

The ground plane 300 shown in FIG. 3 is coupled with or otherwise in communication with a fan 355. The fan 355 provides ventilation for various components coupled with the ground plane. For example, the fan 355 may cool the processor 345 or other circuitry in an antenna structure. In one embodiment, the ground plane 300 is coupled with or otherwise in communication with a single fan 355. In other embodiments, the ground plane 300 is coupled with or otherwise in communication with two or more fans. One or more fans may be positioned at various locations in an antenna structure. In one embodiment, a fan is positioned in an opening of a housing of an antenna structure such that the fan can pull in air from outside the housing and cause the air to flow over electronic components on the ground plane 300. In another embodiment, one fan is positioned on one side of a housing of an antenna structure and a second fan is positioned on another side of the housing. In this embodiment, the fans are positioned so that one fan pulls air from outside the housing into the housing and the other fan pulls air from inside the housing out of the housing. In addition, the fans may be positioned so that air flows over at least some of the electronic components coupled with the ground plane 300. In one embodiment, fan 335 is a noiseless fan.

The ground plane 300 shown in FIG. 3 coupled with or otherwise in communication with two balanced to unbalanced (BALUN) circuits 360, 365. Each of the BALUN circuits 360, 365 can split an unbalanced incoming signal into two balanced signals. In one embodiment, one BALUN circuit such as BALUN circuit 360 is used to split an unbalanced transmit signal into two balanced transmit signals. In this embodiment, another BALUN circuit such as BALUN circuit 365 is used to split an unbalanced receive signal into two balanced receive signals. In such an embodiment, an antenna structure associated with ground plane 300 may provide single input single output (SISO) support. The ground plane 300 may be coupled with or otherwise in communication with more than two BALUN circuits. For example, in an embodiment, the ground plane 300 is in communication with four BALUN circuits. In this embodiment, two BALUN circuits may be used to split two unbalanced transmit signals into four balanced transmit signals and two BALUN circuits may be used to split two unbalanced receive signals into four balanced receive signals. In such an embodiment, an antenna structure may provide multiple input multiple output (MIMO) support. In other embodiments, two or more antenna structures may be connected together to provide MIMO support.

In embodiments, one or more BALUNs used in an antenna structure is a wideband BALUN. For example, one or more BALUNs can be a Wilkinson BALUN. Referring to FIG. 3, in an embodiment, transmit BALUN circuit 360 is a Wilkinson BALUN and receive BALUN circuit 365 is another Wilkinson BALUN. In one embodiment, two three-stage Wilkinson BALUNs are connected with ground plane 300. In this embodiment, transmit BALUN circuit 360 comprises a three-stage Wilkinson BALUN and receive BALUN circuit 365 comprises a three-stage Wilkinson BALUN. One or more BALUNs may be connected with additional circuitry. For example, one or more coplanar waveguides (CPWs) may be connected with one or more BALUNs. In this embodiment, one or more of the coplanar waveguides (CPWs) may contain a broadband 180 degree phase shifter. Other circuitry and variations are within the scope of this disclosure.

Figure 4:
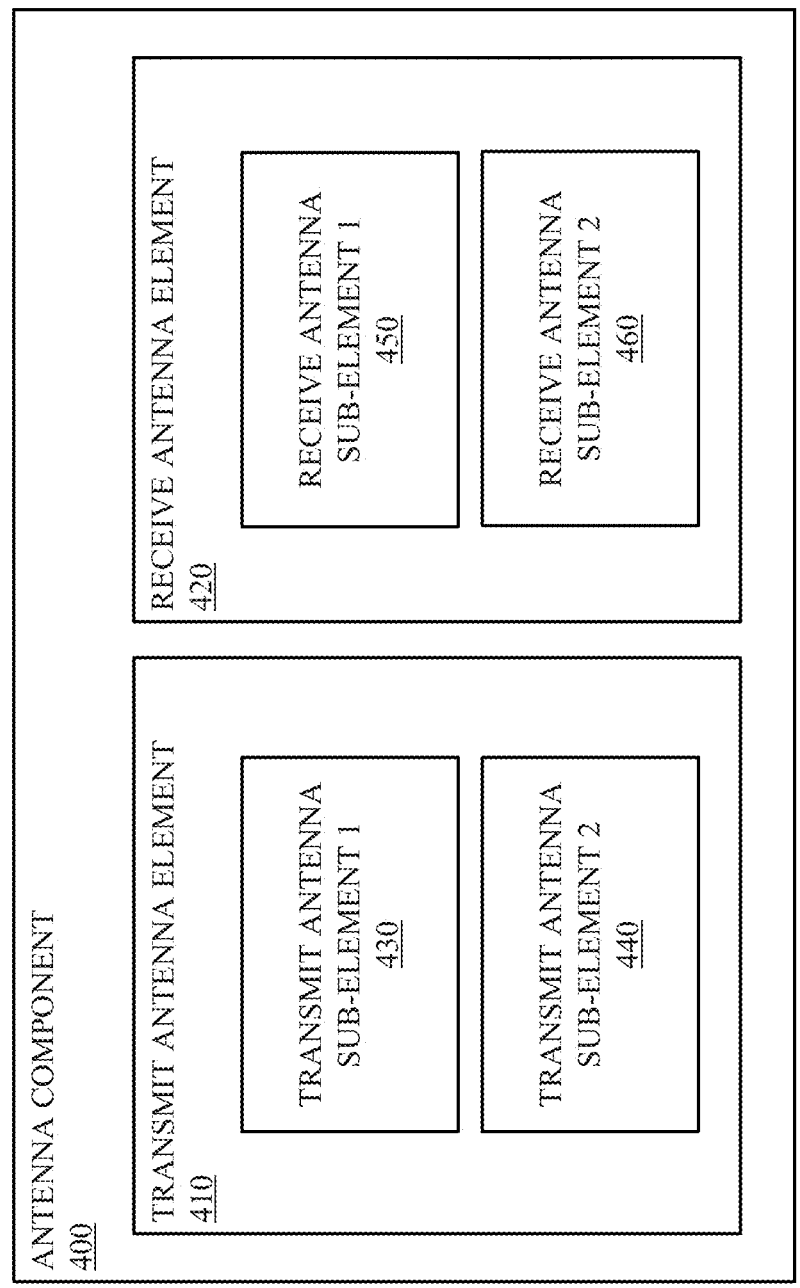
FIG. 4 illustrates an antenna component of an antenna structure according to an embodiment.

Referring back to FIG. 2, the antenna structure 200 shown in FIG. 2 includes an antenna component 230. The antenna component 230 can include any number of elements. For example, FIG. 4 illustrates an antenna component 400 of an antenna structure according to an embodiment. The antenna component 400 shown in FIG. 4 includes one transmit antenna element 410 and one receive antenna element 420. In one embodiment, an antenna structure having an antenna component such as the antenna component 400 shown in FIG. 4 is essentially a dual polar antenna structure. In embodiments, the antenna structure is broad beam and the antenna elements, such as transmit antenna element 410 and receive antenna element 420, are orthogonally polarized.

In FIG. 4, the transmit antenna element 410 comprises two sub-elements 430 and 440. Likewise, the receive antenna element 420 shown in FIG. 4 comprises two sub-elements 450 and 460. The transmit antenna sub-element 430 may be opposite transmit antenna sub-element 440 vis-à-vis a center position. Similarly, the receive antenna sub-element 450 may be opposite receive antenna sub-element 460 vis-à-vis the center position.

Figure 5:
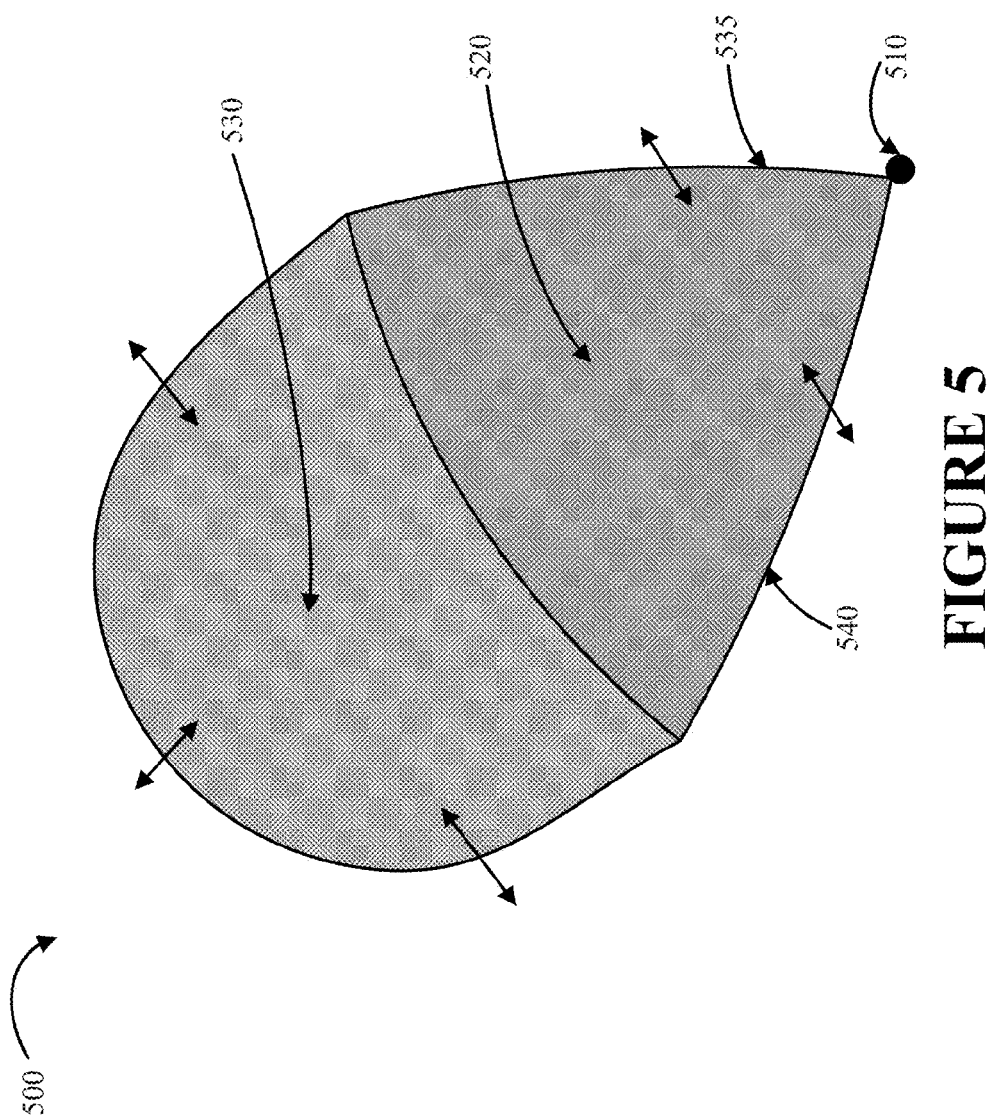
FIG. 5 illustrates a shape of an antenna sub-element for an antenna structure according to an embodiment.

Each antenna sub-element, 430-460, may have a shape that is similar in some ways to a balloon or a teardrop. For example, FIG. 5 illustrates a shape of an antenna sub-element 500 for an antenna structure according to an embodiment. In the embodiment shown in FIG. 5, a first portion 520 of the antenna sub-element 500 is positioned closer to the center position 510 than a second portion 530 of the sub-element 500. In the embodiment shown in FIG. 5, the first portion is at least partially curved. For example, flare 535 may have one or more curvatures. As another example, flare 540 can have one or more curvatures. As shown in FIG. 5, the second portion 530 has a greater cross-sectional width than the first portion 520 and the second portion 530 is at least partially conical.

Figure 6:
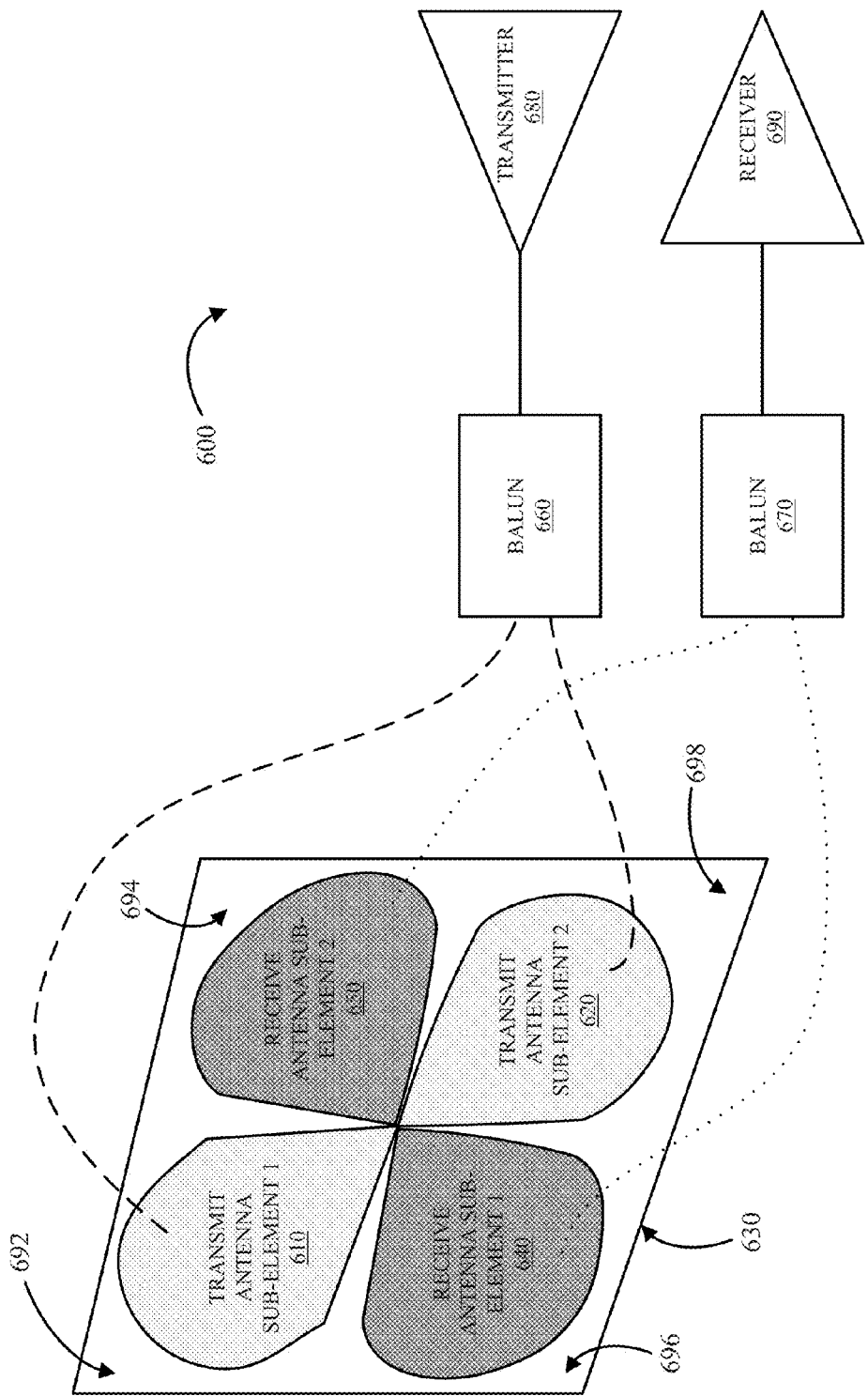
FIG. 6 illustrates aspects of a single input single output (SISO) antenna structure according town embodiment.
Figure 7:
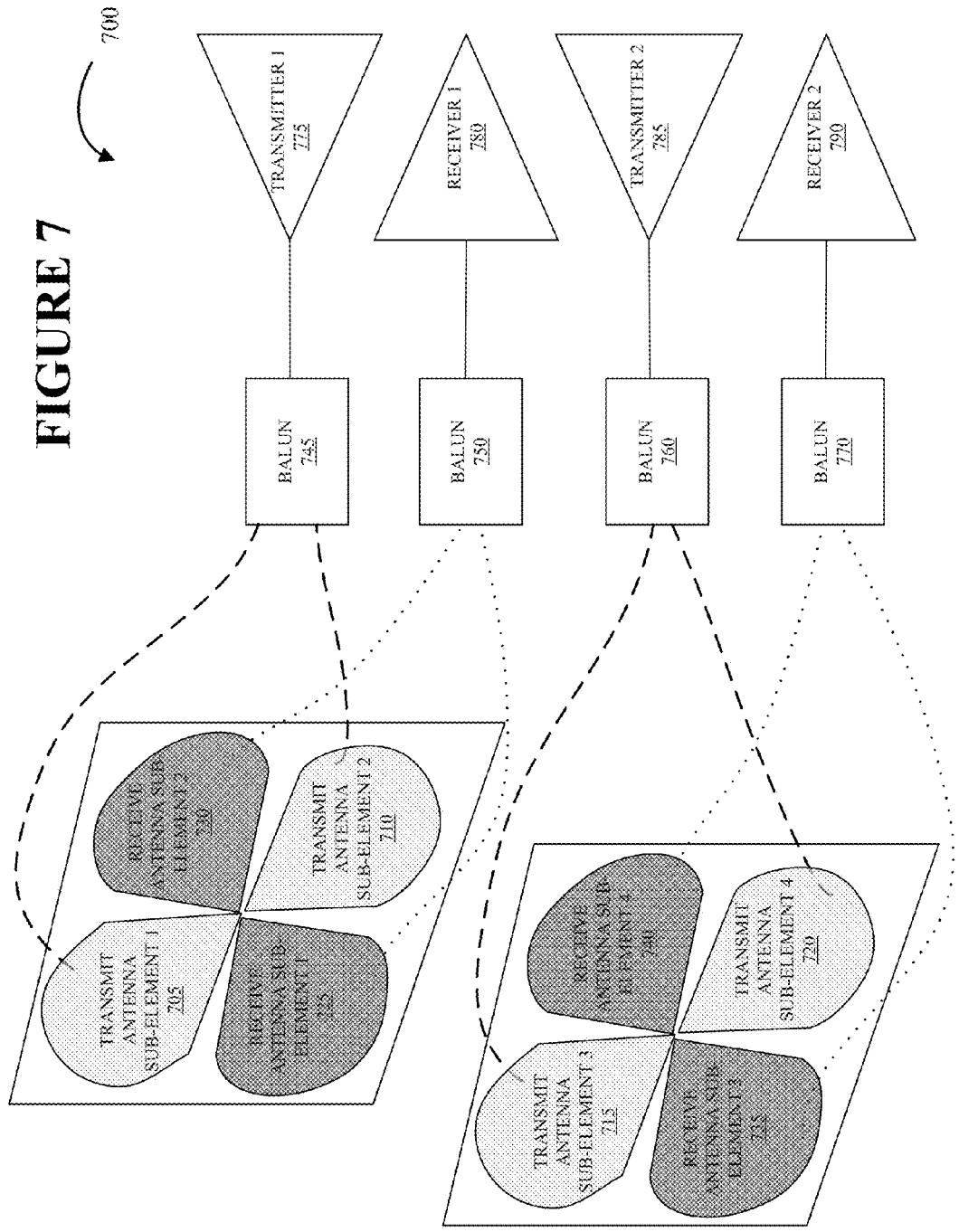
FIG. 7 illustrates aspects of a multiple input multiple output (MIMO) antenna structure according to an embodiment.

In embodiments, one or more antenna sub-elements can be optimized for various situations. For example, one or more sub-elements may be adjusted. As shown in FIG. 5, the overall length of an antenna sub-element 500 can be adjusted. In embodiments, the overall width of the first portion 520 or the second portion 530, or both, can be adjusted. In some embodiments, the curves or edges of the first portion 520 can be adjusted. For example, the curves or edges of flare 535 can be adjusted according to an embodiment. In another embodiment, the curves or edges of flare 540 are adjustable. In some embodiments, the curves or edges of both flare 535 and flare 540 can be modified. In one embodiment, the curves or edges of the second portion 530 can be adjusted. In embodiments, the first portion 520 and the second portion 530 of the antenna sub-element 500 form a cone shape. For example, the edges of flare 535 and the edges of flare 540 in the first portion 520 may be straight or substantially-straight and connected such they form a V-shape. At least part of the second portion 530 may be wider than the widest distance between flare 535 and flare 540 in the V-shape. Thus, as shown in FIGS. 6 and 7, at least part of the second portion may be wider than the first portion. Furthermore, as shown in FIGS. 5, 6, and 7, the second portion 530 may be positioned on or above of the first portion 520 such that the combination forms a V-shaped cone with at least a portion of the second portion 530 extending from the opening in the V. Thus, in one embodiment, the second portion 530 can be arranged such that it is wider than the first portion 520 and such that the second portion 530 is at or near the open top of the V-shape of the first portion 520. An aspect ratio, such as the ratio of the length of the first portion 520 to the length of the second portion 530 of the antenna sub-element 500, may be adjustable. Numerous other embodiments are disclosed herein and variations are within the scope of this disclosure.

Referring back to FIG. 4, in some embodiments high isolation between the transmit antenna element 410 and the receive antenna element 420 can be achieved. In one embodiment, in order to achieve high isolation between the transmit antenna element 410 and the receive antenna element 420, symmetry is maintained in the antenna structure. In this embodiment, each of the four sub-elements, 430-460, have identical physical dimensions. In other embodiments, the four sub-elements, 430-460, have similar physical dimensions.

The four sub-elements, 430-460, shown in FIG. 4 can be configured in a four leaf clover like arrangement about a center position. For example, FIG. 6 illustrates aspects of a single input single output (SISO) antenna structure having a four leaf clover like arrangement according to an embodiment. The embodiment shown in FIG. 6 has a transmitter 680 and a receiver 690. In this embodiment, the transmitter 380 is connected to a BALUN circuit 660 through an unbalanced transmission line. Likewise, the receiver 690 is connected to a BALUN circuit 670 through an unbalanced transmission line. As discussed above, a BALUN circuit can split an unbalanced signal into two balanced signal. Thus, in the embodiment shown in FIG. 6, BALUN circuit 660 receives an unbalanced transmission line from transmitter 680 and outputs two balanced transmission lines. One of the balanced transmission lines from BALUN 660 is connected with transmit antenna sub-element 610 and the other balanced transmission line from BALUN 660 is connected with transmit antenna sub-element 620. Likewise, in FIG. 6, BALUN circuit 670 receives an unbalanced transmission line from receiver 690 and outputs two balanced transmission lines. One of the balanced transmission lines from BALUN 670 is connected with receive antenna sub-element 640 and the other balanced transmission line from BALUN 670 is connected with receive antenna sub-element 650. In embodiments, such an arrangement allows the antenna structure to have a 9:1 or greater bandwidth.

In embodiments, a portion of the antenna component 630 shown in FIG. 6 may be dielectrically loaded. For example, one or more of the corners 692-698 of the antenna component 630 can be dielectrically loaded. In one embodiment, each corner 692-698 of the antenna component 630 is dielectrically loaded. In another embodiment, two corners of the antenna component 630 are dielectrically loaded. For example, corner 692 and 698 may be dielectrically loaded. As another example, corner 694 and 696 may be dielectrically loaded.

One or more portions of the antenna component 630 can be dielectrically loaded with any number of materials having a suitable dielectric constant. In one embodiment, a material having a dielectric constant of approximately 2.9 is used. For example, acrylonitrile butadiene styrene (ABS) may be used to dielectrically load each of corner 692-698. In another embodiment, one or more materials having a dielectric constant greater than 2.9 may be used. In other embodiments, one or more materials having a dielectric constant less than 2.9 may be used. In various embodiments, one or more materials having a suitable dielectric constant can include, but is not limited to, ABS, Noryl, Noryl 30% glass filled, Nylon MD, Nylatron Unfilled®, Nylon GSM, Delrim Acetal, Polysulfone, Polypropylene, Perspex, Acrylic, or other materials. In some embodiments, one dielectric material may be used. For example, in one embodiment, one dielectric material may be used in each of corners 692-698. In other embodiments, two or more dielectric materials can be used. For example, in one embodiment, a dielectric material may be used in corners 692, 698 and another dielectric material may be used in corners 694, 696.

In embodiments a portion or all of various components in the antenna structure may be dielectrically loaded. For example, a ground plane, such as the ground plane 300 shown in FIG. 3, may be dielectrically loaded. In one embodiment, the entire ground plane 300 is dielectrically loaded. In other embodiments, one or more portions of the ground plane 300 can be dielectrically loaded with one or more dielectric materials. Other variations are within the scope of this disclosure.

FIG. 7 illustrates aspects of a multiple input multiple output (MIMO) antenna structure according to an embodiment. The embodiment shown in FIG. 7 has two transmitters 775, 785 and two receivers 780, 790. In this embodiment, each of the lines between the transmitters, receivers, and the four BALUN circuits 745-770 are unbalanced. As described in FIG. 6, each BALUN circuit 745-770 can receive one unbalanced transmission line and output two balanced transmission lines. Thus, in FIG. 7, BALUN 745 is connected with transmit antenna sub-element 705 and transmit antenna sub-element 710. Likewise BALUN 760 is connected with transmit antenna sub-element 715 and transmit antenna sub-element 720. In the embodiment shown in FIG. 7, BALUN 750 is connected with receive antenna sub-element 725 and receive antenna sub-element 730. Similarly, BALUN 770 is connected with receive antenna sub-element 735 and receive antenna sub-element 740. In FIG. 7, each of the sub-elements 705-740 has a similar shape. The sub-elements 705-804 are arranged in two four-leaf clover-like patterns.

Cross-Sectional View of an Illustrative Antenna Structure

Figure 8:
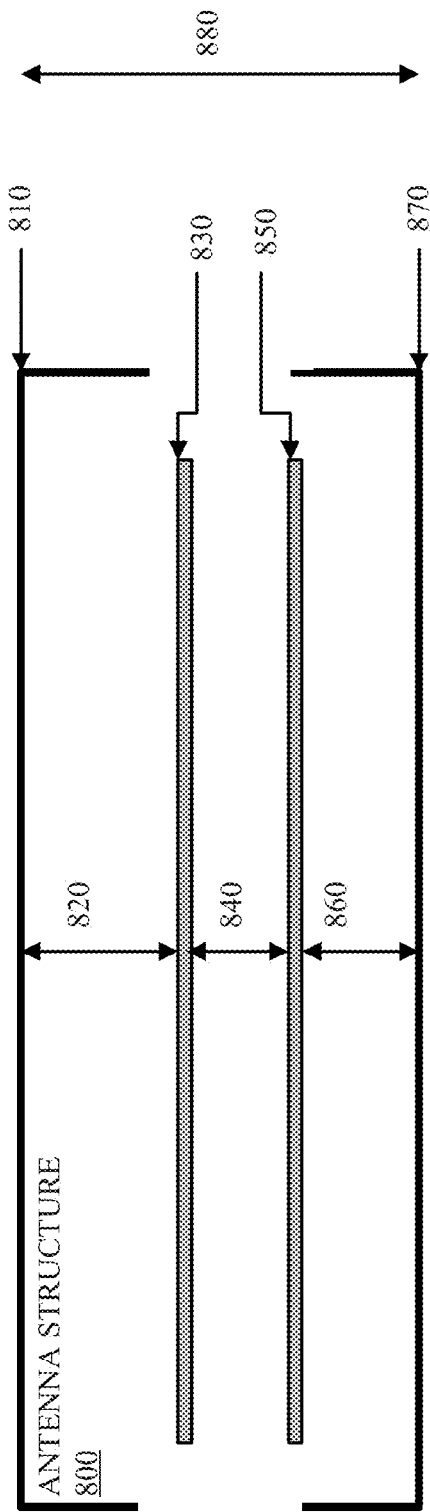
FIG. 8 illustrates a cross-sectional view of an antenna structure according to an embodiment.

FIG. 8 illustrates a cross-sectional view of an antenna structure 800 according to an embodiment. The antenna structure 800 shown in FIG. 8 includes a top housing 810, a ground plane 830, an antenna component 850, and a bottom housing 870. In the embodiment shown in FIG. 8, the overall dimensions of the antenna structure are approximately 12 inches×12 inches×2.75 inches. In this embodiment, the approximate 2.75 inch thickness can be based on the following approximate measurement. The top housing 810 and the bottom housing 870 may each be approximately 0.12 inches thick. A cooling gap 820 of approximately 0.5 inches may exist between the top housing 810 and the ground plane 830. The cooling gap 820 may be an air gap between the top housing and the ground plane 830. In embodiments, one or more fans or vents positioned in various locations of a housing of the antenna structure 800 can cause or allow air to flow over the various electronic components on the ground plane 830 through the cooling gap 820.

In FIG. 8, the ground plane has a thickness of approximately 0.1 inches. In this embodiment, an antenna gap 840 exists between the ground plane 830 and the antenna component 850. In one embodiment, the antenna gap 840 may be an air gap between the ground plane 830 and the antenna component 850. In embodiments, one or more fans or vents positioned in various locations of a housing of the antenna structure 800 can cause of allow air to flow over the various components on the ground plane 830 through the antenna gap 840.

In FIG. 8, the antenna 850 is approximately 0.03 inches thick. In other embodiments, the antenna may be less than 0.03 inches thick. In some embodiments, the antenna may be greater than 0.03 inches thick. For example, in one embodiment, the antenna may be approximately 0.06 inches thick. In the embodiment shown in FIG. 8, there is a clearance gap 860 of approximately 0.37 inches. Thus in the embodiment shown in FIG. 8, the overall thickness 880 of the antenna structure 800 is approximately 2.75 inches. In some embodiments, there may be less of a clearance gap 860. In other embodiments, there may be no clearance gap 860. Thus, in some embodiments, the overall thickness 880 of the antenna structure can be approximately 2.5 inches or less.

Shapes of Antenna Structures in Embodiments

Figure 9A:
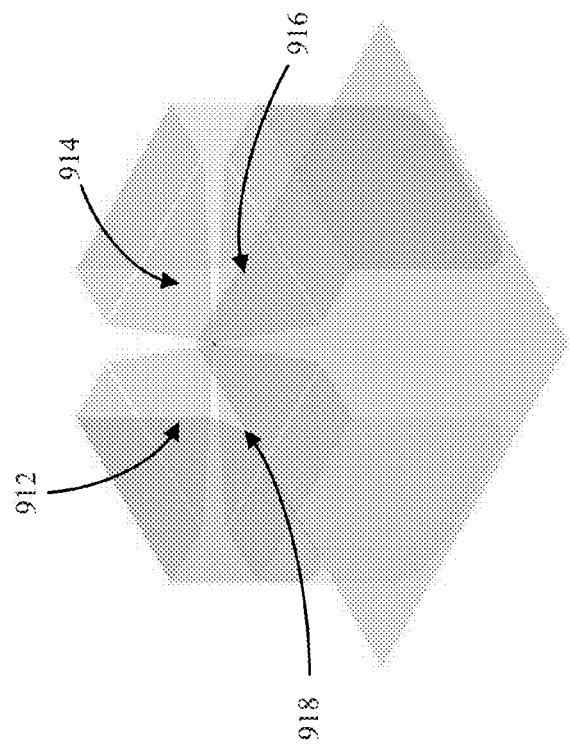
FIGS. 9A-9F illustrate shapes of antenna structures according to various embodiments.
Figure 9B:
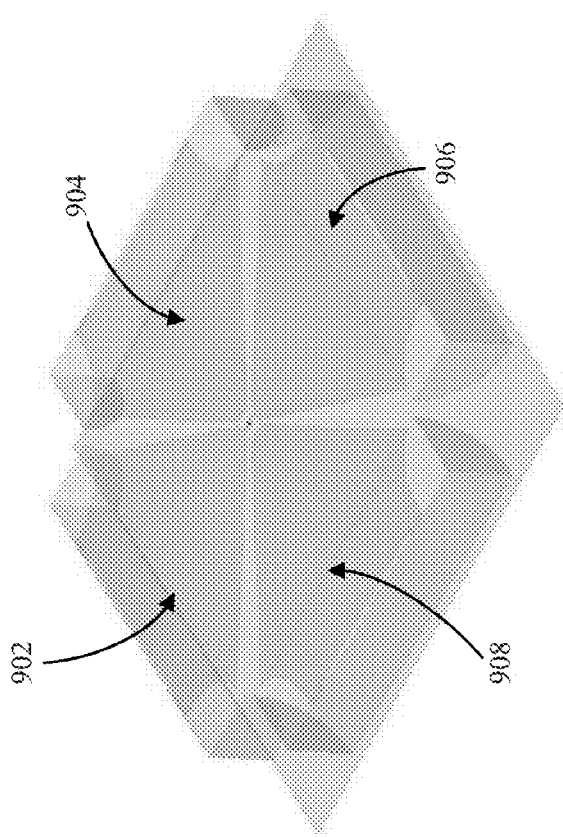
Figure 9C:
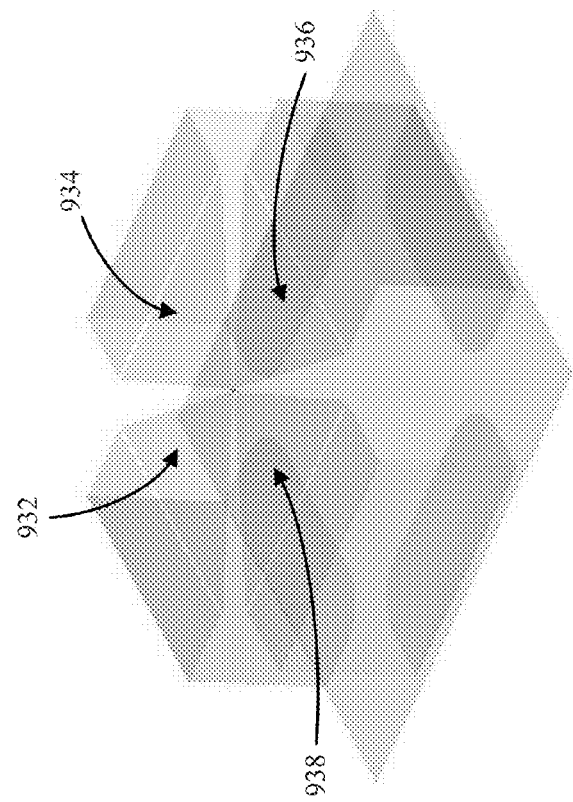
Figure 9D:
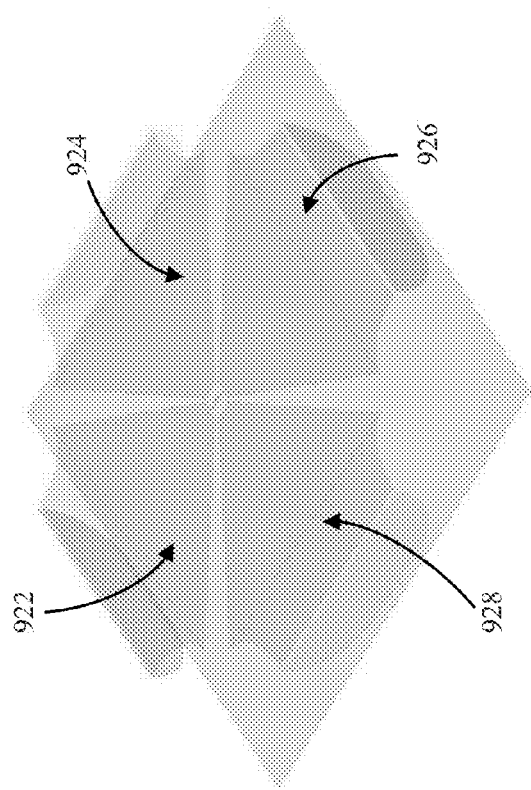
Figure 9E:
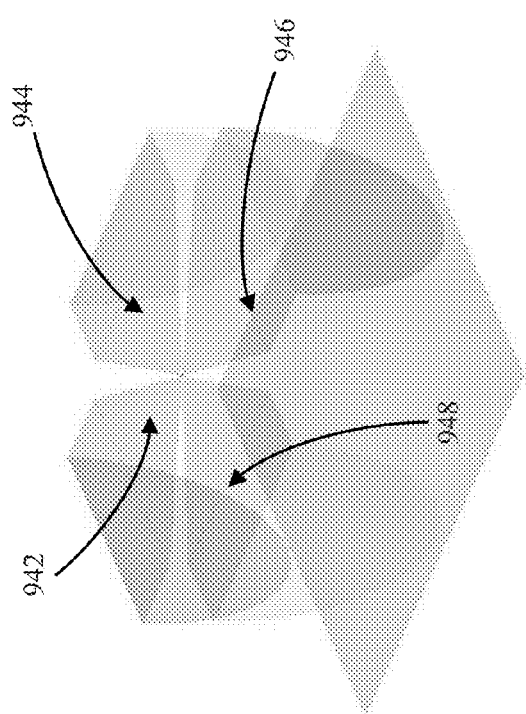
Figure 9F:
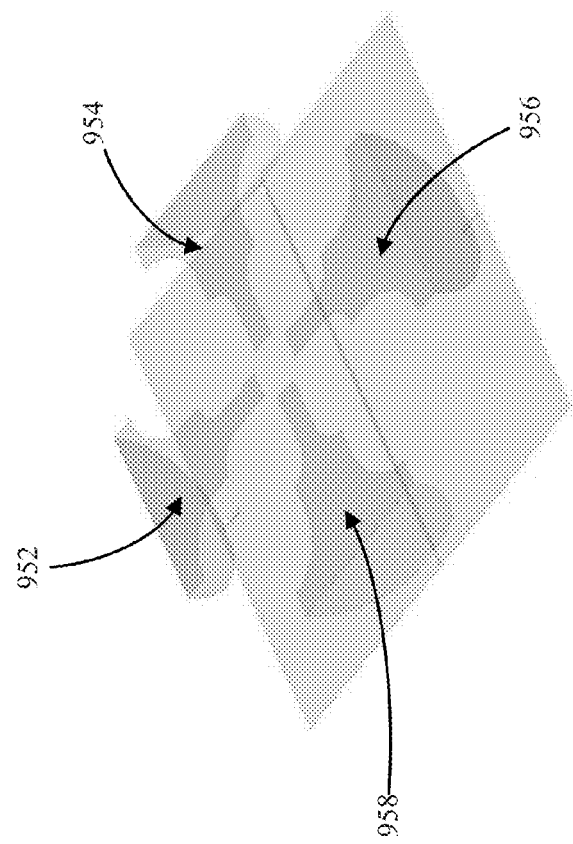

FIGS. 9A-9F illustrate shapes of antenna structures according to various embodiments. One or more of the shapes of the sub-elements 902-958 of the antenna structures shown in FIGS. 9A-9F may be used in any number of applications. For example, one or more sub-elements 902-908 shown in FIG. 9A can replace one or more sub-elements 610, 620, 640, 650 shown in FIG. 6. As another example, one or more sub-elements 912-918 shown in FIG. 9B may be used instead of one or more sub-elements 705-740 shown in FIG. 7. In embodiments, FIGS. 9A-9F provide shapes of various antenna structures. For example, FIG. 9A illustrates an antenna structure having a low profile with bent corners. As another example, FIG. 9B illustrates an antenna structure having bent corners with a capacitive gap. Any number of shapes for one or more sub-elements and/or antenna structures may be used. For example, the antenna structure shown in FIG. 9C has a low profile and bent corners with a capacitive gap. As another example, FIG. 9D illustrates an antenna structure having double bent corners with a capacitive gap. FIG. 9E illustrates one embodiment of an antenna structure having rounded elements. FIG. 9F illustrates another shape of an antenna structure according to an embodiment. In this embodiment, the antenna is fed at the ends of the elements by the ground plane and not at the center of the antenna. In various embodiments, sub-elements of an antenna structure and/or an antenna structure has a low profile, one or more bent corners, one or more capacitive gaps, one or more rounded elements, or a combination thereof. In other embodiments, any number of shapes of antenna structures, including but not limited to the shapes of the sub-elements 902-958 of antenna structures shown in FIGS. 9A-9F, can be used in one or more antenna structures. Numerous other shapes of antenna sub-elements and/or antenna structures are disclosed herein and variations are within the scope of this disclosure.

Illustrative BALUN Circuit

FIGS. 10A-10B illustrate views of a balanced to unbalanced (BALUN) circuit 1000 according to an embodiment. FIG. 10A illustrates a top view of a BALUN circuit 1000 according to an embodiment. FIG. 10B illustrates a bottom view of a BALUN circuit 1000 according to an embodiment. The BALUN circuit 1000 shown in FIGS. 10A and 10B may be used in any number of applications. For example, the BALUN circuit 1000 shown in FIGS. 10A and 10B may be used in transmit BALUN circuit 360 and/or receive BALUN circuit 365 shown in FIG. 3. As another example, the BALUN circuit 1000 shown in FIGS. 10A and 10B can be used in BALUN 660 and/or BALUN 670 shown in FIG. 6. In one embodiment, the BALUN circuit 100 shown in FIGS. 10A and 10B may be used for BALUN 745, 750, 760, and/or 770 shown in FIG. 7. Numerous other embodiments are disclosed herein and variations are within the scope of this disclosure.

The BALUN circuit 1000 shown in FIGS. 10A and 10B meets various design criteria. For example, an antenna can comprise two halves which are fed separately. In this embodiment, the BALUN combines the two feeds into a single output. The BALUN circuit 1000 can be configured for a wideband operating bandwidth. For example, in one embodiment, the BALUN covers 380 to 2700 MHz with accurate phase or amplitude balance, or both. In other embodiments, the BALUN circuit 1000 can cover any suitable frequency ranges. In one embodiment, the BALUN circuit 1000 has at least a 9:1 or greater operational bandwidth. The BALUN circuit 100 may include a phase shifter. For example, the phase of the two antenna outputs can be 180 degrees apart according to one embodiment. The BALUN circuit 1000 shown in FIGS. 10A and 10B has a two layer design with vias connecting the top layer (e.g., FIG. 10A) with the bottom layer (e.g., FIG. 10B). The top layer of the embodiment shown in FIG. 10A, comprises a board material 1010 and pathways 1020. Any suitable material may be used to for the board material 1010 and/or the pathways 1020. For example, the board material 1010 may be made of a suitable dielectric such as Rogers 4350. In one embodiment, the board 1010 has a thickness of 0.030 inches. As another example, the pathways 1020 can be made of a suitable material such as copper. In one embodiment, the copper is gold plated. Numerous other embodiments are disclosed herein and variations are within the scope of this disclosure.

As shown in FIG. 10B, the BALUN circuit 1000 comprises two connectors 1030, 1040. The connectors 1030, 1040 may be used to connect with two halves of an antenna. The BALUN circuit 1000 may have a combined port. For example, the wide trace 1050 shown in FIG. 10B is a combined port according to an embodiment. The BALUN circuit 1000 may function as a receive BALUN or a transmit BALUN. In an embodiment where the BALUN circuit functions as a receive BALUN, the combined port is an output. In an embodiment where the BALUN circuit functions as a transmit BALUN, the combined port is an input going to an antenna. The output impedance at the two connectors 1030, 1040 may be any suitable impedance. For example, in one embodiment, the output impedance at the two connectors 1030, 1040 is 75 Ohms. Similarly, the impedance at the combined port can be any suitable impedance. In one embodiment, the combined port impedance is 50 Ohms. Numerous other embodiments are disclosed herein and variations are within the scope of this disclosure.

The BALUN circuit 1000 may comprise one or more Wilkinsons. A Wilkinson may comprise any number of stages. For example, a Wilkinson may have a single stage. As another example, a Wilkinson may have two, three, four, or more stages. In one embodiment, the BALUN circuit 1000 comprises one or more three stage Wilkinson splitters. As another example, the BALUN circuit 100 may comprise one or more three stage Wilkinson combiners. In yet other embodiments, the BALUN circuit 1000 comprises one or more Wilkinsons having two, three, four, five, or more stages. As shown in FIG. 10A, a Wilkinson may be implemented in microstrip. One or more balancing resistors may be connected to one or more trace loops used to implemented the one or more Wilkinsons. For example, referring to FIG. 10A, three balance resistors 1060 are connected to the three trace loops 1070. Numerous other embodiments are disclosed herein and variations are within the scope of this disclosure.

One or more traces may be used to connect one or more of the connectors 1030, 1040. In an embodiment, one or more traces comprise one or more coplanar waveguides (CPW). For example, referring to FIG. 10A, the top trace 1080 connects to connector 1040 and is a coplanar waveguide. In the embodiment shown in FIG. 10A, the top trace 1080 is a straight through connection. An inductor to ground may be used at one end of a trace. For example, in FIG. 10A, the top trace 1080 has a small inductor to ground at the end of the trace. Still referring to FIG. 10A, the bottom trace 1090 connects to connector 1030 and is a coplanar waveguide. The bottom trace 1090 may contain a 180 degree phase shifter. For example, in one embodiment and as shown in FIGS. 10A and 10B, a 180 degree phase shift is achieved by reversing the signal and ground traces of the coplanar waveguide line. In an embodiment, a phase shift is needed to properly feed two halves of an antenna to which the BALUN is designed to be connected with.

A phase shift may be needed for isolation. For example, crosstalk from other co-located antennas can be common to two halves of an antenna. In this embodiment, the common mode crosstalk can be greatly reduced or cancelled by inverting the lower signal and combining it with the upper signal. In one embodiment, the degree to which the crosstalk can be reduced is dependent on how well balanced in amplitude and phase two coplanar waveguides are. For example, the lower coplanar waveguide may cause amplitude and/or phase variation at the low end of the band. In this embodiment, an inductor in the top coplanar waveguide may compensate, at least partially, for the amplitude and/or phase variation by causing the same or similar variations at the low end of the band. Such an embodiment may improve the isolation between a transmit antenna and a receive antenna. Numerous other embodiments are disclosed herein and variations are within the scope of this disclosure.

General

Numerous specific details are set forth herein to provide a thorough understanding of the subject matter. However, those skilled in the art will understand that the subject matter may be practiced without these specific details. In other instances, methods, apparatuses or systems that would be known by one of ordinary skill have not been described in detail so as not to obscure subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed is:

1. An antenna structure comprising:
   a transmit antenna element comprising a first transmit antenna sub-element and a second transmit antenna sub-element;
   a receive antenna element comprising a first receive antenna sub-element and a second receive antenna sub-element;
   at least one electronic component coupled with a ground plane, the at least one electronic component comprising:
      a transmit balanced to unbalanced (BALUN) circuit coupled between the transmit antenna element and a transmitter; and
      a receive BALUN circuit coupled between the receive antenna element and a receiver;
   wherein the first transmit antenna sub-element, the second transmit antenna sub-element, the first receive antenna sub-element, and the second receive antenna sub-element each comprise a first portion and a second portion, the second portion being larger than the first portion, the first portion being closer to a center position of an arrangement of the sub-elements than the second portion; and
   wherein the arrangement of the sub-elements about the center position forms a four-leaf clover-like arrangement.

2. The antenna structure of claim 1, wherein the first portion comprises a V-shaped cone design, and wherein at least a part of the second portion extends from an opening in the V-shaped cone design.

3. The antenna structure of claim 1, wherein at least a section of the first portion comprises a curvature.

4. The antenna structure of claim 1, wherein at least one corner of the antenna structure is dielectrically loaded with a material having a dielectric constant of approximately 2.9.

5. The antenna structure of claim 4, wherein the material is acrylonitrile butadiene styrene (ABS).

6. The antenna structures of claim 1, wherein the first transmit antenna sub-element and the second transmit antenna sub-element are opposite each other via the center position.

7. The antenna structures of claim 1, wherein the first receive antenna sub-element and the second receive antenna sub-element are opposite each other via the center position.

8. The antenna structure of claim 1, wherein the transmit antenna element and the receive antenna element are orthogonally polarized.

9. The antenna structure of claim 1, wherein the electronic component comprises at least two balanced to unbalanced (BALUN) circuits.

10. The antenna structure of claim 9, wherein each of the at least two BALUN circuits comprises a Wilkinson BALUN.

11. The antenna structure of claim 9, further comprising at least one coplanar waveguide (CPW) with a 180 degree phase shifter connected with one or more of the at least two BALUN circuits.

12. The antenna structure of claim 1, wherein the antenna structure provides high isolation between the transmit antenna element and the receive antenna element over a wideband operating bandwidth.

13. The antenna structure of claim 12, wherein high isolation between the transmit antenna element and the receive antenna element comprises at least 40 dB isolation between the transmit antenna element and the receive antenna element.

14. The antenna structures of claim 12, wherein the wideband operating bandwidth comprises at least a 9:1 bandwidth.

15. The antenna structure of claim 12, wherein the wideband operating bandwidth comprises an operating bandwidth of approximately 380 MHz to approximately 2700 MHz.

16. The antenna structures of claim 1, wherein the antenna structure has a low profile, the low profile comprising a height of 3 inches or less.

17. The antenna structure of claim 1, further comprising an air gap between the ground plane and at least one of the transmit antenna element or the receive antenna element.

18. The antenna structure of claim 1, further comprising at least one fan connected with the ground plane, wherein the at least one fan is configured to cause air to flow over the at least one electronic component.

19. The antenna structure of claim 1, wherein at least a portion of the ground plane is dielectrically loaded.

20. A balanced to unbalanced (BALUN) circuit comprising:
- a first connector configured to be connected to a first half of an antenna;
- a second connector configured to be connected to a second half of the antenna, the second half different than the first half;
- a first trace coupled to the first connector, the first trace comprising at least a first coplanar waveguide and an inductor to ground;
- a second trace coupled to the second connector, the second trace comprising at least a second coplanar waveguide and a 180-degree phase shifter;
- at least one Wilkinson BALUN coupled to the first trace and the second trace;
- a combined port coupled to the at least one Wilkinson BALUN; and
- wherein the balanced to unbalanced circuit is configured for a wideband operating bandwidth.

\* \* \* \* \*